(12) United States Patent
Makabe et al.

(10) Patent No.: US 6,577,553 B2
(45) Date of Patent: Jun. 10, 2003

(54) SEMICONDUCTOR MEMORY DEVICE

(75) Inventors: Ryu Makabe, Hyogo (JP); Masaki Tsukude, Hyogo (JP); Hirotoshi Sato, Hyogo (JP); Shinichi Kobayashi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/123,167

(22) Filed: Apr. 17, 2002

(65) Prior Publication Data

US 2002/0159323 A1 Oct. 31, 2002

(30) Foreign Application Priority Data

Apr. 26, 2001 (JP) ........................................ 2001-129945

(51) Int. Cl.[7] .................................................. G11C 8/00
(52) U.S. Cl. .............................. 365/230.06; 365/230.09
(58) Field of Search ....................... 365/230.06, 230.09, 365/233, 229, 228, 241

(56) References Cited

U.S. PATENT DOCUMENTS 5,905,690 A * 5/1999 Sakurai et al. ............... 365/201
5,970,021 A * 10/1999 Sakurai ....................... 365/195
6,201,748 B1 * 3/2001 Nakamura et al. ...... 365/189.11

* cited by examiner

*Primary Examiner*—Richard Elms
*Assistant Examiner*—Anh Phung
(74) *Attorney, Agent, or Firm*—McDermott, Will & Emery

(57) ABSTRACT

Successive data read access with a final address specified is detected by a command mode detecting circuit to set a command mode entry status. In the command mode entry, a command of designating an internal state is made acceptable in accordance with a predetermined external signal. Consequently, a semiconductor memory device that enters a command mode, maintaining compatibility of pins and signal timings with a conventional static memory is provided.

16 Claims, 12 Drawing Sheets

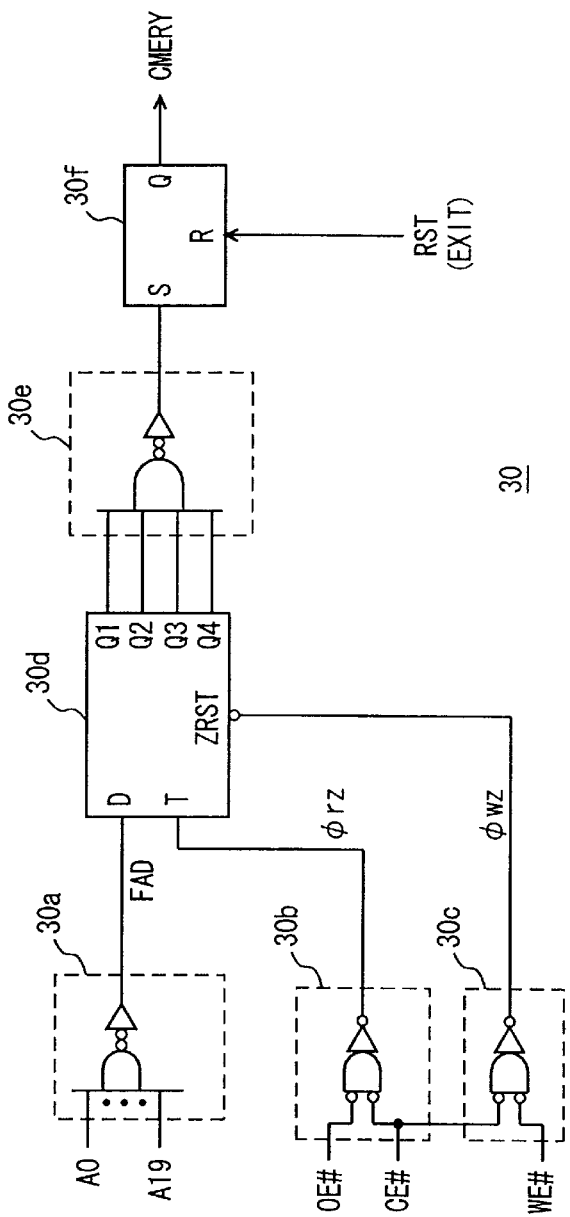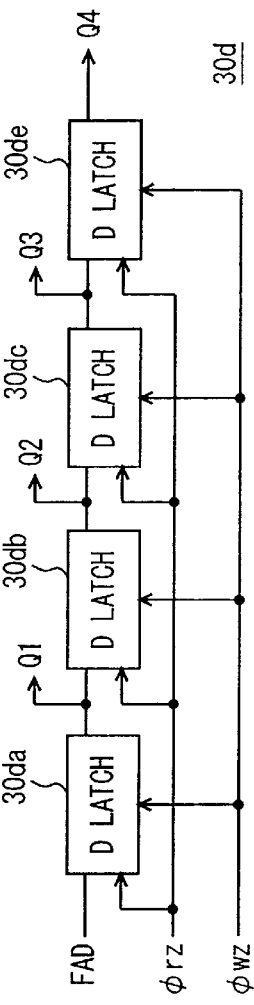
F I G. 5A
F I G. 5B

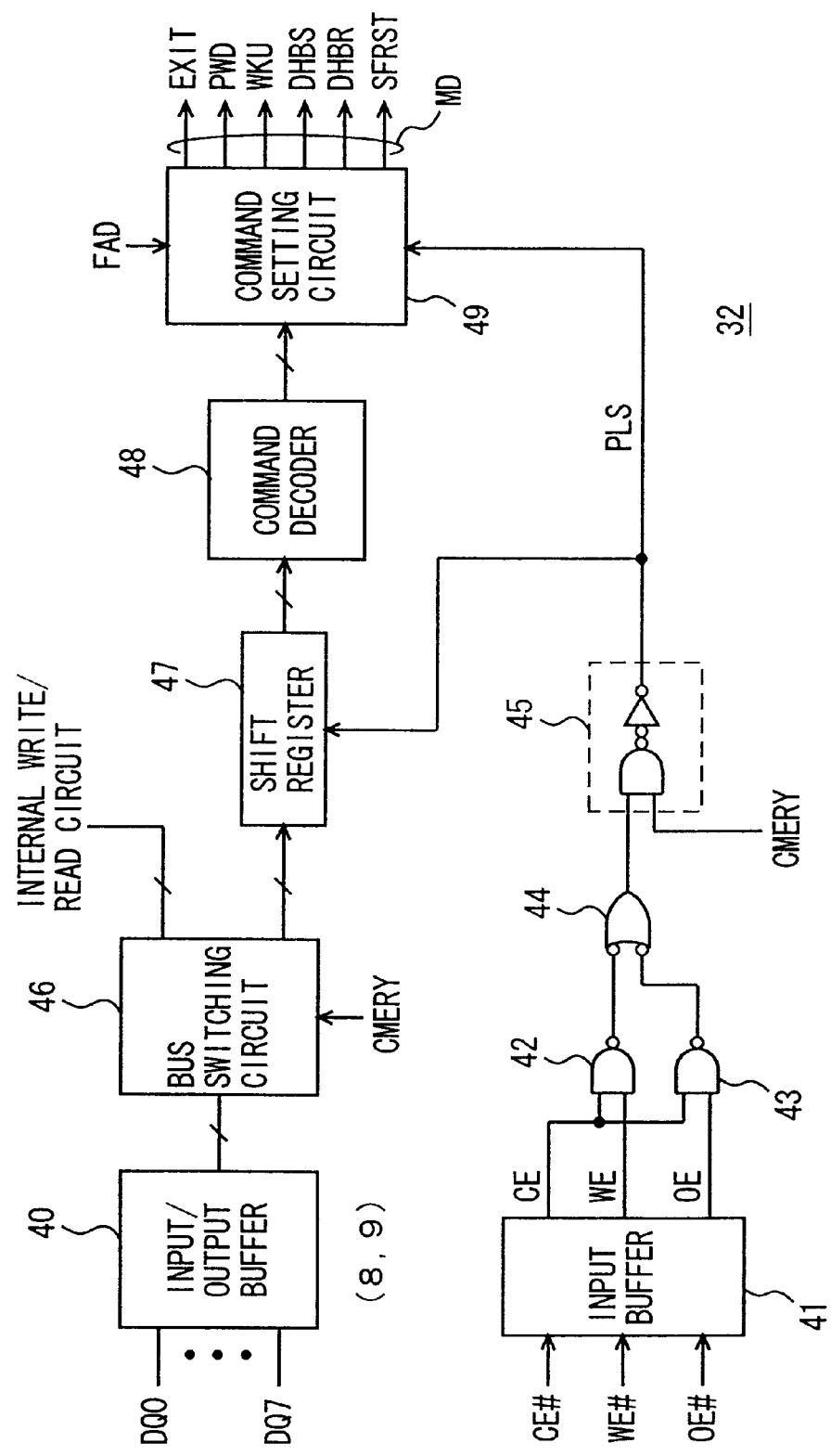
F I G. 8

(AFTER POWER ON, NORMAL MODE SETTING COMPLETED)

SEMICONDUCTOR MEMORY DEVICE

BACKGROUND OF THE INVENTION

1. Field of the Invention

The present invention relates to a semiconductor memory device and, particularly, to an SRAM alternative memory replaceable with a static random access memory (SRAM), having compatibility with an SRAM. More particularly, the invention relates to the configuration for setting an SRAM alternative memory into a specific mode.

2. Description of the Background Art

In an application of portable equipment, an SRAM is used as an internal memory because of its high processing speed. A memory cell of the SRAM is constructed of four transistors and two load elements, and the occupying area of the SRAM cell is large. Therefore, it is difficult to implement a memory of a large storage capacity in a limited area.

As the functions of portable equipment are enhanced, it is necessary to process image data and audio data. The amount of data to be processed becomes enormous and a memory of a large storage capacity is required as a memory device for the portable equipment. When using an SRAM as the internal memory, it is difficult to implement the memory of a large storage capacity in a small occupying area, so that a requirement of down-sizing and lightening high-function portable equipment cannot be met.

On the other hand, the memory cell of a dynamic random access memory (DRAM) is constructed of one transistor and one capacitor in general. The DRAM has, therefore, an advantage that the occupying area of the memory cell is smaller than that of the SRAM. The DRAM is suitable for constructing a memory of a large storage capacity in a small occupying area. However, the DRAM stores data in the capacitor and the stored data is lost by a leak current, so that refreshing operation for holding stored data has to be periodically performed. During execution of the refreshing, an external device such as a processor cannot access the DRAM and is kept in a wait state, so that the processing efficiency of the system is lowered.

The DRAM is designated of a sleep mode and held in a standby state in a waiting time in portable equipment or the like. Also in the sleep mode, however, stored data has to be held and has to be periodically refreshed. Therefore, an ultra low standby current condition of the order of $\mu A$ in the sleep mode required in a specification or the like cannot be satisfied.

In order to implement the memory of a large storage capacity with a small occupying area, a DRAM-based memory has to be used. In the case of using such a DRAM-based memory (hereinbelow, called an SRAM alternative memory), the memory has to be replaced without significantly changing the conventional system configuration. That is, compatibility of pins is required. Here, the "memory" indicates a memory device connected to a device such as an external processor via pin terminals.

Different from a synchronous memory operating synchronously with a clock signal such as a system clock, an SRAM operates statically according to an external control signal. In order to prevent the load of the external processor from increasing, the SRAM alternative memory is required to operate under the same operating conditions (signal timings) as those of the SRAM.

Particularly, in the case of designating various operation modes in the SRAM alternative memory, in view of compatibility of pins, the operation modes have to be set by using signals prepared for a conventional SRAM. Particularly, as for designation of an operation mode which is not prepared for the conventional SRAM, signals used in the SRAM are generally a chip enable signal CE, an output enable signal OE, and a write enable signal WE, and therefore, a complicated signal timing relation cannot be used for setting a specific operation mode. In the case of designating a specific operation mode with a relation of the timings of signals different from the timings of signals used in a general SRAM, an external device such as a memory controller has to be provided with a new function. Consequently, compatibility with a conventional SRAM cannot be maintained, and a load on the external device increases.

SUMMARY OF THE INVENTION

An object of the invention is to provide an SRAM alternative memory having pin compatibility with an SRAM.

Another object of the invention is to provide a semiconductor memory device capable of designating an internal operation mode by using signals similar to those used for an SRAM.

Still another object of the invention is to provide a semiconductor memory device capable of designating a specific operation mode asynchronously with a clock signal without increasing the number of pin terminals.

Further object of the invention is to provide a semiconductor memory device having a circuit for setting a command entry mode for designating a specific operation mode by using an interface compatible with an SRAM.

A semiconductor memory device according to a first aspect of the present invention includes: mode detecting circuitry for detecting that external signals of a predetermined set are applied in a combination of specific logic states a predetermined number of times successively; and mode setting circuitry for setting a specific mode in response to a detection signal from the mode detecting circuitry.

A semiconductor memory device according to a second aspect of the invention is a semiconductor memory device accessed in accordance with an external signal in a normal operation mode, and includes a command decoder that is made active in a specific mode to decode a plurality of predetermined external signals out of the external signals for generating a signal for setting an internal state to a predetermined state. The command decoder generates a signal for designating an operation related to a standby state.

A semiconductor memory device according to a third aspect of the present invention is a semiconductor memory device accessed in accordance with an external signal in a normal operation mode, and includes mode detecting circuitry for detecting that a predetermined set of external signals out of the external signals is applied in a combination of specific logic states a predetermined number of times successively; mode setting circuitry for setting a specific mode in response to a detection signal of the mode detecting circuitry; and a command decoder that is made active in accordance with an output signal of the mode setting circuitry to decode a plurality of predetermined external signals out of the external signals for generating a signal for setting an internal status to a predetermined status. The command decoder generates a signal for designating an operation related to a standby state.

By setting the internal state in accordance with the states of predetermined external signals, the internal state can be set into a desired state by using signals of a conventional SRAM. Thus, a semiconductor memory device having compatibility with a convention SRAM can be implemented.

By the construction that the semiconductor memory device enters a specific mode when a specific state is executed a predetermined number of times successively, the semiconductor memory device can be prevented from entering the specific mode erroneously in the normal mode. Thus, a stably operating semiconductor memory device can be implemented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5A is a diagram schematically showing the configuration of a command mode detecting circuit shown in FIG. 4;

FIG. 5B is a diagram schematically showing the configuration of a shift register shown in FIG. 5A;

FIG. 8 is a diagram schematically showing the configuration of a mode decoding circuit shown in FIG. 4;

DESCRIPTION OF THE PREFERRED EMBODIMENTS

First Embodiment

Figure 1:
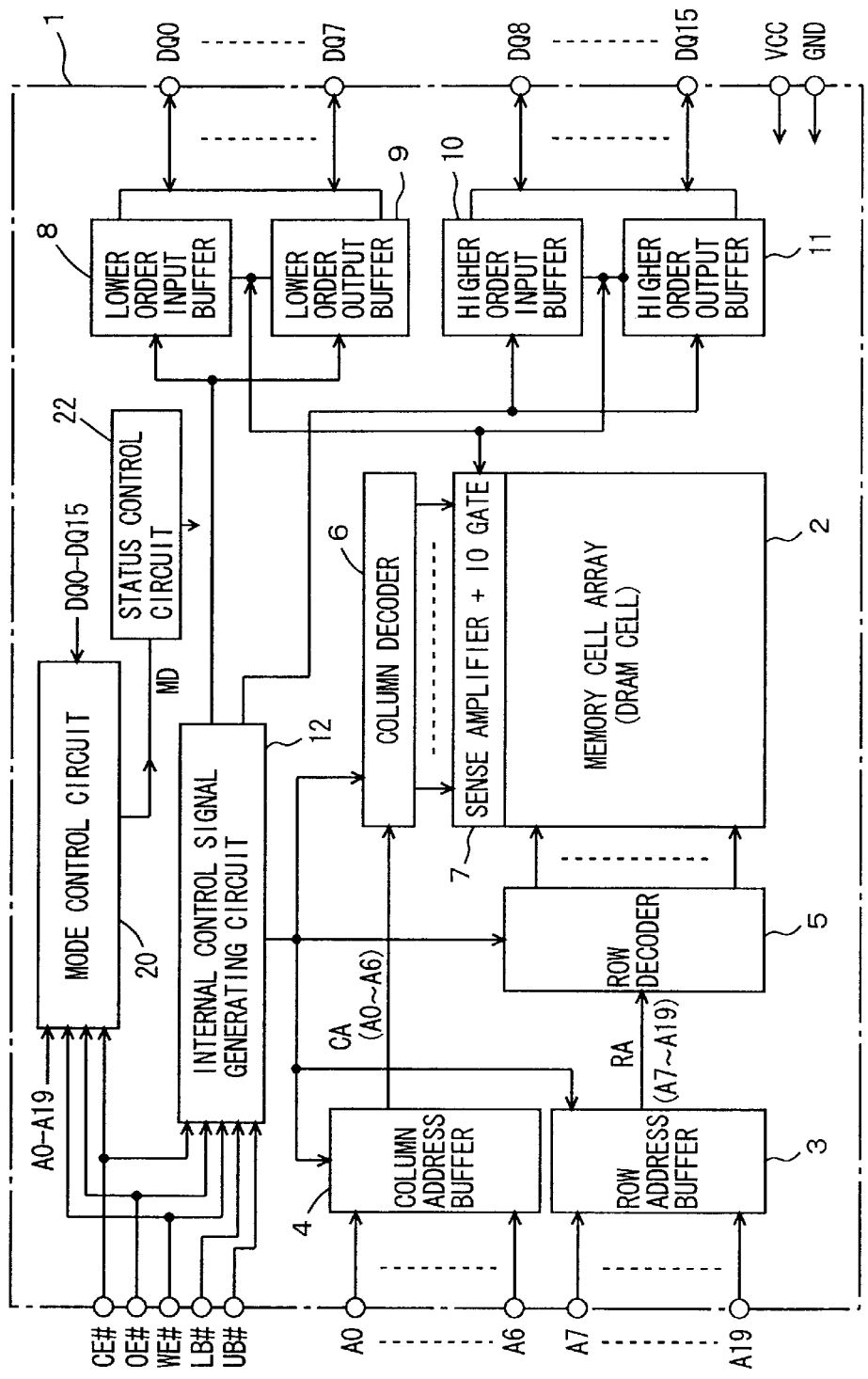
FIG. 1 is a diagram schematically showing the entire configuration of a semiconductor memory device according to a first embodiment of the invention.

FIG. 1 is a diagram schematically showing the entire configuration of a semiconductor memory device according to a first embodiment of the present invention. In FIG. 1, a semiconductor memory device 1 includes: a memory cell array 2 having a plurality of memory cells arranged in a matrix; a row address buffer 3 receiving address signal bits A7 to A19 from an outside and generating an internal row address signal RA; a column address buffer 4 receiving address signal bits A0 to A6 from the outside and generating an internal column address signal CA; a row decoder 5 for decoding internal row address signal RA and selecting a row in memory cell array 2; a column decoder 6 for decoding internal column address signal CA and generating a column selection signal for selecting a column in memory cell array 2; a sense amplifier for sensing amplifying and latching data of memory cells on the row selected by row decoder 5; and an I/O gate for connecting the selected column in memory cell array 2 to an internal data line (I/O line) in accordance with the column selection signal from column decoder 6. In FIG. 1, the sense amplifier and the I/O gate are indicated by a block 7.

Semiconductor memory device 1 further includes: a lower-order input buffer 8 for writing lower byte data DQ0 to DQ7 in data writing operation; a lower-order output buffer 9 for outputting the lower byte data to an outside in data reading operation; a higher-order input buffer 10 for receiving upper byte data DQ8 to DQ15 and generating internal write data in data writing operation; a higher-order output buffer 11 for outputting upper byte data DQ8 to DQ15 in data reading operation; and an internal control signal generating circuit 12 for generating signals for controlling various internal operations in accordance with externally applied control signals, such as a chip enable signal CE#, an output enable signal OE#, a write enable signal WE#, a lower byte enable signal LB#, and an upper byte enable signal UB#.

When chip enable signal CE# is at the L level, it instructs that semiconductor memory device 1 is selected, and semiconductor memory device 1 can be accessed. When output enable signal OE# is at the L level, a data reading mode is designated. When write enable signal WE# is at the L level, a data writing mode is designated. When lower byte enable signal LB# is at the L level, it instructs that lower byte data DQ0 to DQ7 is valid. When upper byte enable signal UB# is at the L level, it instructs that upper byte data DQ8 to DQ15 is valid.

Internal control signal generating circuit 12 controls the operations of row address buffer 3, column address buffer 4, row decoder 5, column decoder 6, and sense amplifier/IO gate block 7 in accordance with chip enable signal CE#, output enable signal OE#, and write enable signal WE#. Internal control signal generating circuit 12 further controls the active/inactive state of each of lower-order input buffer 8, lower-order output buffer 9, higher-order input buffer 10, and higher-order output buffer 11 in accordance with upper byte enable signal UB# and lower byte enable signal LB#, depending on the designated operation mode.

Semiconductor memory device 1 further includes: a mode control circuit 20 receiving control signals CE#, OE#, and WE#, address signals A0 to A19, and data bits DQ0 to DQ15, for setting semiconductor memory device 1 into a specific operation mode; and a status control circuit 22 for setting the internal status of semiconductor memory device 1 into a designated status in accordance with a mode setting signal MD from mode control circuit 20. The configuration of mode control circuit 20 will be described in detail later.

When semiconductor memory device 1 is accessed in an access sequence that is not used in a normal access mode, semiconductor memory device 1 enters a command mode for accepting a command of designating a specific internal status. In this state, a command designating an internal status is supplied by using data bits DQ0 to DQ15, with a specific address designated. According to the decoding result of the command, internal status setting signal (mode setting signal) MD is generated.

Status control circuit 22 sets the internal status to, for example, an initial status or a power-down status in accordance with status control signal MD from mode control circuit 20. Status control circuit 22 sets an internal status related to an operation mode required of low power consumption such as a standby status. The configurations of these circuits will be described in detail later. By using an external command for setting the internal status, it becomes unnecessary to use a dedicated pin terminal for designating a status such as a power-down status. With the same signal timing relationship as that in the normal operation mode for accessing data, a desired operation mode can be designated. An external memory controller or the like can designate a desired operation mode only by changing a program. It is unnecessary to significantly change the internal configuration of a conventional external device, and compatibility with a conventional memory can be easily maintained.

Figure 2:
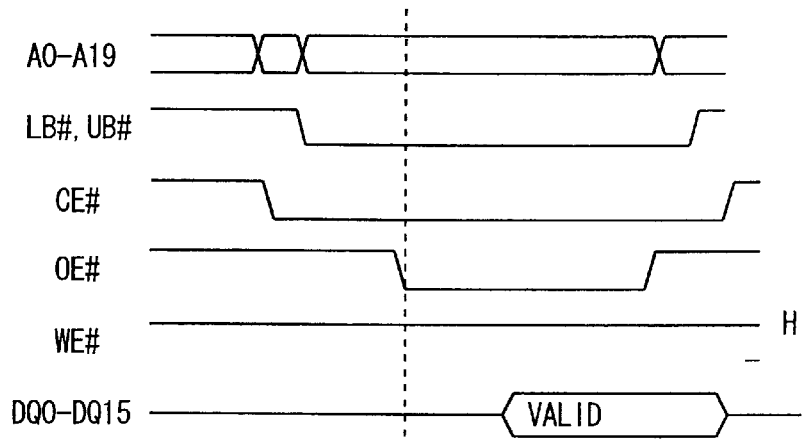
FIG. 2 is a signal waveform diagram representing data reading operation of the semiconductor memory device shown in FIG. 1.

FIG. 2 is a signal waveform diagram representing data reading operation of semiconductor memory device 1 shown in FIG. 1. In FIG. 2, chip enable signal CE# is set to the L level, and upper byte enable signal UB# and lower byte enable signal LB# for designating upper byte data and lower byte data, respectively, are set selectively to the L level in accordance with data bits to be read. In this state, address signal bits A0 to A19 are set and, subsequently, output enable signal OE# is set to the L level. Write enable signal WE# is maintained at the H level.

By using the falling to the L level of output enable signal OE# as a trigger, under control of internal control signal generating circuit 12, row address buffer 3 and column address buffer 4 take in externally applied address signal bits A19 to A0 and generate internal row address signal RA and internal column address signal CA, respectively. According to internal row address signal RA and internal column address signal CA, row decoder 5 and column decoder 6 perform decoding operation at predetermined timings under control of internal control signal generating circuit 12, memory cells are selected, and data of the selected memory cells are read out.

When upper byte enable signal UB# is at the H level, upper byte data DQ8 to DQ15 enters a high impedance state. When lower byte enable signal LB# is set to the L level, valid data is read as lower byte data DQ0 to DQ7. The external data maintains the valid state for a period since output enable signal OE# goes high until the output circuit is set in a disable state.

Figure 3:
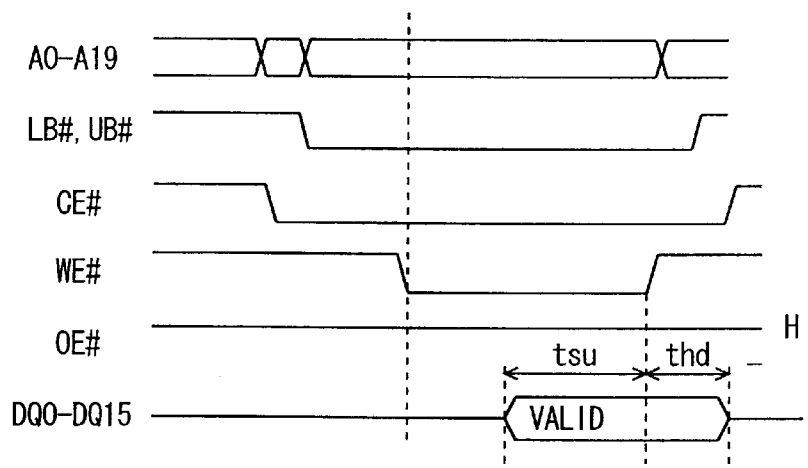
FIG. 3 is a signal waveform diagram representing data writing operation of the semiconductor memory device as shown in FIG. 1.

FIG. 3 is a signal waveform diagram representing data writing operation of semiconductor memory device 1 shown in FIG. 1. As shown in FIG. 3, also in the data writing operation, according to upper byte enable signal UB# and lower byte enable signal LB#, validity/invalidity of upper byte data and lower byte data is designated. When chip enable signal CE# is at the low level, semiconductor memory device 1 can be accessed. In the data writing operation, write enable signal WE# is lowered to the L level. By using the falling of write enable signal WE# as a trigger, externally applied address bits A19 to A0 are taken into the inside, internal row address signal RA and internal column address signal CA are generated accordingly, and a memory cell selecting operation is performed by row decoder 5 and column decoder 6 shown in FIG. 1. Data bits DQ0 to DQ15 supplied externally are selectively written internally in accordance with upper byte enable signal UB# and lower byte enable signal LB#.

Data bits DQ0 to DQ15 are required of a setup time tsu and a hold time thd relative to the rising edge of write enable signal WE#. Semiconductor memory device 1 shown in FIG. 1 is a DRAM-based semiconductor memory device in which row selecting operation and column selecting operation are executed time-division-multiplexedly. When a data access is designated by write enable signal WE# or read enable signal OE#, a row address signal and a column address signal are internally generated in accordance with an address signal externally applied. Upon selection of a memory cell, the row selecting operation is performed first, and memory cell data is latched by the sense amplifier. Subsequently, the column selecting operation is performed and data of the selected memory cell is read or data is written to the selected memory cell.

Write enable signal WE# has to be maintained at the L level for the period in which the column selecting operation is performed. In order to write data into the selected memory cell through the column selecting operation, the setup time tsu is required for external data bits DQ0 to DQ15. Hold time thd may be therefore 0 ns (nano second) at the minimum.

As shown in the timing charts of FIGS. 2 and 3, semiconductor memory device 1 shown in FIG. 1 takes in externally applied address signals in accordance with chip enable signal CE#, output enable signal OE#, and write enable signal WE#, and writes or reads data. The control signals used in semiconductor memory device 1 are the same as those used in an SRAM. Therefore, the interface of semiconductor memory device 1 has compatibility with an SRAM.

When an access is made in a sequence different from a normal access sequence in accordance with external control signals CE#, OE#, and WE# and address signal bits A0 to A19, mode control circuit 20 determines that a mode (command mode) for designating a specific operation mode is designated. In the command mode, mode control circuit 20 controls an internal operation status in accordance with an external signal (command). Specifically, when a specific access sequence is executed, the command mode is set to allow acceptance of external applied command. In the command mode, when a signal such as a data bit applied externally is written with a specific address designated, the external signal is taken in as a command, and the internal status is set to a status designated by the command.

Figure 4:
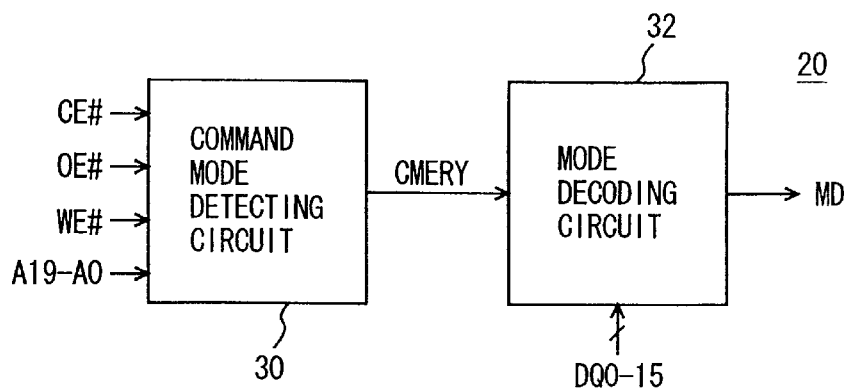
FIG. 4 is a diagram schematically showing the configuration of a mode control circuit shown in FIG. 1.

FIG. 4 is a diagram schematically showing the configuration of mode control circuit 20 shown in FIG. 1. In FIG. 4, mode control circuit 20 includes: a command mode detecting circuit 30 receiving external control signals CE#, OE#, and WE# and address signal bits A19 to A0 and, when the signals are supplied in a predetermined sequence, generating a command mode entry signal CMERY; and a mode decoding circuit 32 that is activated when command entry signal CMERY is made active, for taking in and decoding predetermined bits in data bits DQ0 to DQ15 as a command and generating mode setting signal MD in accordance with the result of decoding.

When address signal bits A19 to A0 designate a specific address and an access is made a predetermined number of times successively, command mode detecting circuit 30 activates command mode entry signal CMERY. Specifically, as an example, when data is read from the final address (FFFFFH) four times successively, command mode detecting circuit 30 activates command mode entry signal CMERY. When command mode entry signal CMERY is made active, mode decoding circuit 32 enters an external command acceptable state.

In the normal operation mode, it is very rare to read data from the same address four times successively. Particularly, the final address is not generally used so much. By setting the command mode when an access is made in a access sequence different from that in the normal access mode, without using a complicated signal timing relationship, the command mode can be reliably designated only with the signal timing relationship as that in the normal operation mode.

Even when valid data is stored in the final address, the read mode is merely designated, and therefore, the data stored in the final address is just read in the command mode entry and is not destructed.

FIG. 5A is a diagram schematically showing an example of the configuration of command mode detecting circuit 30 shown in FIG. 4. In FIG. 5A, command mode detecting circuit 30 includes: a decoding circuit 30a for decoding address signal bits A0 to A19; a read mode detecting circuit 30b receiving output enable signal OE# and chip enable signal CE# and activating, when the data read mode is designated, a read mode instruction signal $\phi rz$; a write mode detecting circuit 30c receiving chip enable signal CE# and write enable signal WE# and driving, when the data write mode is designated, a write mode instruction signal $\phi wz$ to the L level; a shifter 30d for sequentially transferring an output signal FAD of address decoding circuit 30a in accordance with read mode instruction signal $\phi rz$ from read mode detecting circuit 30b; a sequence decoding circuit 30e for decoding output bits Q1 to Q4 of shifter 30d; and a flip flop 30f that is set when the output signal of sequence decoding circuit 30e is at the H level. Command mode entry signal CMERY is generated from flip flop 30f.

Address decoding circuit 30a sets decode signal FAD to the H level when all of address signal bits A19 to A0 are "0". That is, when the final address "FFFFFH" is designated, decode signal FAD is set to the H level. Read mode detecting circuit 30b sets read mode instruction signal $\phi rz$ to the L level when both output enable signal OE# and chip enable signal CE# are in the active state of the L level. Write mode detecting circuit 30c sets write mode instruction signal $\phi wz$ to the L level when both write enable signal WE# and chip enable signal CE# are in the active state or the L level.

Shifter 30d includes cascaded D latches 30da to 30de of four stages as shown in FIG. 5B. When read mode instruction signal $\phi rz$ goes low, each of D latches 30da to 30de takes in a signal received at its input. When read mode instruction signal $\phi rz$ goes high, each of D latches 30da to 30de enters a latch state of latching and outputting the taken in signal. When write mode instruction signal $\phi wz$ goes low, output data bits Q1 to Q4 of D latches 30da to 30de are reset to "0".

When all output bits Q1 to Q4 of shifter 30d is set high, sequence decoding circuit 30e sets the output signal to the H level to set/reset flip flop 30f, thereby driving command mode entry signal CMERY to the H level. Set/reset flip flop 30f is reset by a reset signal RST generated when a command mode exit command or the like is supplied.

Flip flop 30f is used for the following reason. That is, operation modes designated upon entry into the command mode include a mode of reading data in a memory block designated as a data holding block, as will be described later, and data reading operation may be designated. In the command entry mode, therefore, a command is not always written.

Figure 6:
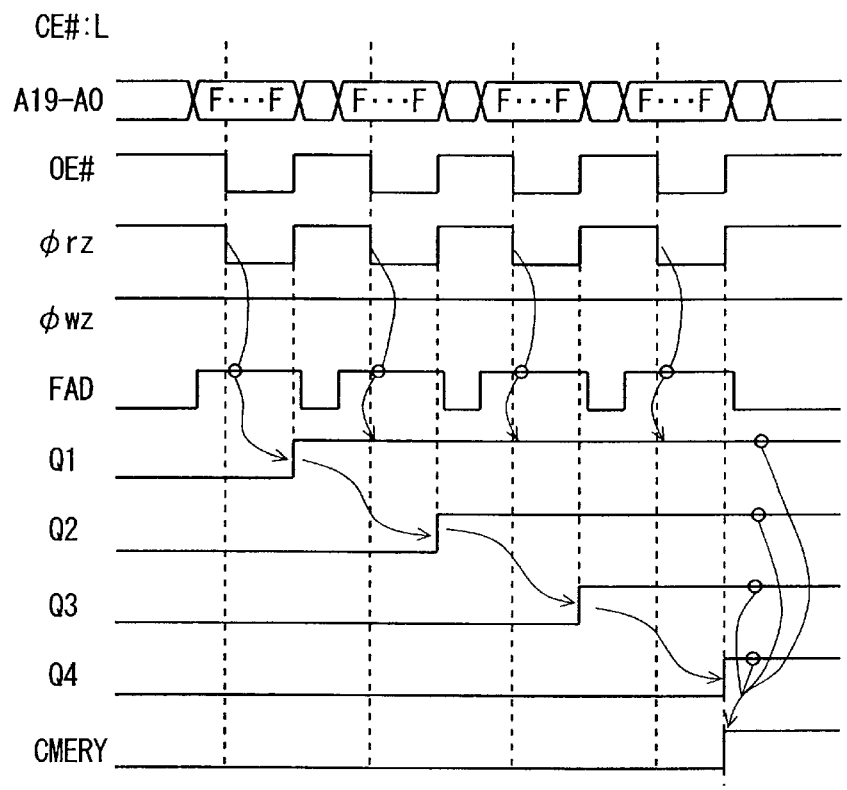
FIG. 6 is a timing chart representing operation of the command mode detecting circuit shown in FIGS. 5A and 5B.

FIG. 6 is a timing chart representing an operation of command mode detecting circuit 30 shown in FIGS. 5A and 5B. With reference to FIGS. 5A, 5B, and 6, the operation of command mode detecting circuit 30 will be described below.

All of address signal bits A0 to A19 are set to the H level to designate the final address FFFFFH. Subsequently, output enable signal OE# is set to the L level to instruct the data read mode. Since chip enable signal CE# is at the L level, when the data read mode is designated, read mode instruction signal $\phi rz$ from read mode detecting circuit 30b goes low, and shifter 30d takes in decode signal FAD from decoding circuit 30a. When output enable signal OE# is once set to the H level, the data read mode is completed.

The semiconductor memory device shown in FIG. 1 is a DRAM-based semiconductor memory device. By output enable signal OE#, one access cycle for performing row selection and column selection is specified. To complete an access cycle, output enable signal OE# is once set to the H level. When output enable signal OE# goes high, read mode instruction signal $\phi rz$ from read mode detecting circuit 30b goes high, shifter 30d performs shifting operation, and output bit Q1 of shifter 30d is set to the H level. Specifically, each of D latches 30da to 30de shown in FIG. 5B takes in a signal applied to its input when read mode detection signal $\phi rz$ is at the L level and outputs the taken in signal from its output, and enters a latch state when read mode instruction signal $\phi rz$ goes high.

Subsequently, the operation of reading data in final address FFFFFH is performed four times. In response to the rising of read mode detection signal $\phi rz$, all of output bits Q1 to Q4 of shifter 30d go high, and accordingly, set/reset flip flop 30f is set to set command mode entry signal CMERY to the H level. The semiconductor memory device is consequently set into the command mode.

Final address FFFFFH is hardly accessed in the normal operation mode, and data is rarely read from the same address four times successively in the normal operation mode. What can be considered at most is a mode of reading upper byte data and lower byte data from the final address. In this case, data is read from the final address only twice successively. Therefore, data is not read from the final address four times successively in the normal operation cycle, so that the semiconductor memory device can be set reliably into the command mode without exerting an adverse influence on the operation in the normal operation mode.

In the case where the data writing operation mode is designated at the time of command mode entry, write mode instruction signal $\phi wz$ goes low, shifter 30b is reset, and all of output bits Q1 to Q4 go low. In this case, the command mode entry operation has to be executed again from the beginning.

In the case of reading data with an address different from the final address designated in the command mode entry, decode signal FAD output from address decoding circuit 30a is set to L level. In this case, one of bits Q1 to Q4 of shifter 30d is set to L level until data is read from the final address four times successively. Therefore, only when data is read from the final address four times successively, command mode entry signal CMERY can be set to the H level. Thus, an access made in a sequence different from that in the normal operation mode can be identified to designate the command mode.

A command mode is set using the signals similar to those used for an SRAM, that is, chip enable signal CE#, output enable signal OE#, write enable signal WE# and address signals. The command mode can be set asynchronously with a clock signal such as a system clock signal. Thus, a command mode can be set using an interface compatible with an SRAM.

Address signal bits A0 to A19 supplied to decoding circuit 30a may be signals from row address buffer 3 and column address buffer 4 shown in FIG. 1. When output enable signal OE# goes low, each of address buffers 3 and 4 takes in an address signal and generates an internal address signal. Address signal bits A0 to A19 to decoding circuit 30a may be signals generated via a mere input buffer circuit.

Figure 7:
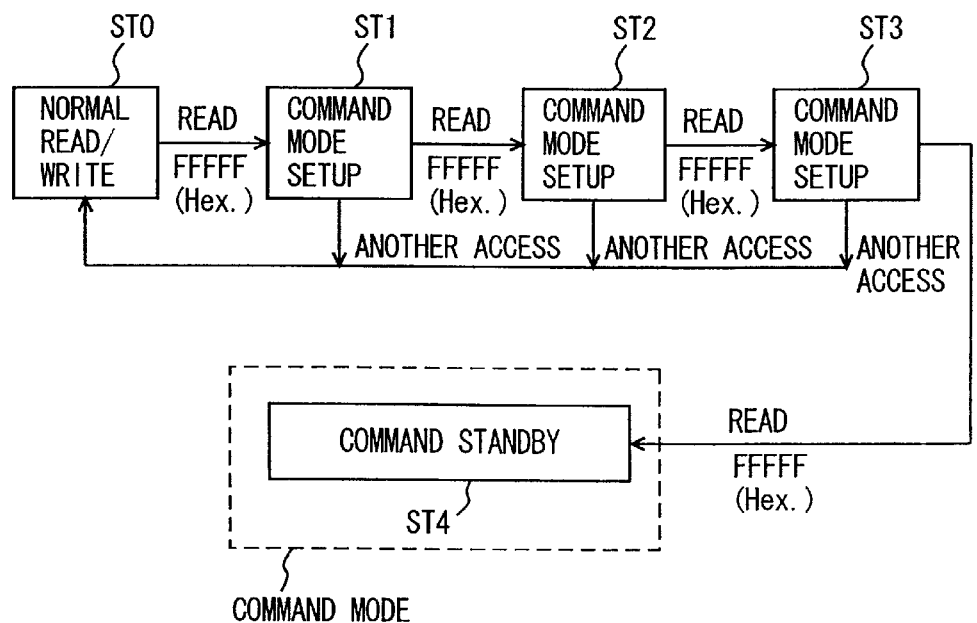
FIG. 7 is a diagram showing status transition upon command mode entry.

FIG. 7 is a diagram showing status transition upon command mode entry of the semiconductor memory device according to the first embodiment of the invention. Referring to FIG. 7, the status transition at the time of command mode entry will be briefly described below.

In a normal read/write status ST0 in which normal data reading/writing operation is performed, an instruction of reading data from address FFFFFH (Hex) is applied. By the operation of reading data from the final address, the status shifts to a command mode setup status ST1. In command mode setup status ST1, operation of reading data from the final address is executed again. The status shifts to the subsequent command mode setup status ST2 where an instruction of reading the data from the final address is applied again. Then, the status shifts to a final command mode setup status ST3. After the data in the final address is read again in the final command mode setup status ST3, semiconductor memory device 1 enters a command mode and a command standby status ST4 of waiting for a command is set.

In the case where an access different from that of reading data from the final address is made in any of setup statuses ST1 to ST3, the command mode setup is reset, and the status is reset to normal read/write status ST0.

FIG. 8 is a diagram schematically showing the configuration of mode decoding circuit 32 shown in FIG. 4. In FIG. 8, at the preceding stage of mode decoding circuit 32, an input/output buffer 40 for inputting/outputting external data DQ0 to DQ7 and an input buffer 41 for receiving external control signals CE#, WE#, and OE# are provided. Input/output buffer 40 corresponds to input buffer 8 and output buffer 9 shown in FIG. 1. Input buffer 41 buffers chip enable signal CE#, write enable signal WE#, and output enable signal OE# externally applied to generate an internal chip enable signal CE, an internal write enable signal WE, and an internal output enable signal OE. Internal chip enable signal CE, internal write enable signal WE, and internal output enable signal OE are each set to the H level when activated.

Mode decoding circuit 32 includes: an NAND circuit 42 receiving internal chip enable signal CE and internal write enable signal WE; an NAND circuit 43 receiving internal chip enable signal CE and internal output enable signal OE; an NAND circuit 44 receiving output signals from NAND circuits 42 and 43; an AND circuit 45 receiving an output signal of NAND circuit 44 and command mode entry signal CMERY and generating a pulse signal PLS; a shift register 47 for sequentially transferring received data in accordance with pulse signal PLS; a bus switching circuit 46 for connecting input/output buffer 40 to either an internal write/read circuit or shift register 47 in accordance with command mode entry signal CMERY; a command decoder 48 for decoding data output from shift register 47; and a command setting circuit 49 for latching an output signal of command decoder 48 and generating an internal operation mode instruction signal in accordance with decode signal FAD from the address decoding circuit shown in FIG. 5A and pulse signal PLS.

In the command mode, lower byte data DQ0 to DQ7 is used as a command and upper byte data DQ8 to DQ15 is not used. In the command mode, the application of the command is detected by decode signal FAD. Therefore, for example, when data is written with an address other than the final address designated in the command mode, a command is not taken in.

The internal write/read circuit includes a preamplifier and a write driver and transmits/receives internal data to/from a selected memory cell in the memory cell array. When the command mode is designated, the internal write/read circuit is disconnected from the input/output buffer, so that data is not written/read into/from the memory cell array. In the command mode, the row/column selecting operation may be inhibited. In this configuration, the row/column selecting operation is inhibited by command mode entry signal CMERY. However, circuitry for receiving the address signal and data is made operable. Alternatively, in the case of receiving data bits DQ0 to DQ7 and address signal bits A0 to A19 via a mere buffer circuit to perform the command mode entry and the command mode setting, since the buffer circuits operate asynchronously with an external control signal, all of circuits for executing an normal access related to the row and column selection may be set, in the command mode, to an operation stopped stated (standby state) in accordance with command mode entry signal CMERY.

According to an output signal of command decoder 48, command setting circuit 49 generates: an exit instruction signal EXIT for completing the command mode and making transition to the normal operation mode; a power down instruction signal PWD for cutting off supply of power to internal circuits; a wake up instruction signal WKU for completing the power down mode; a data holding block setup signal DHBS for designating a data holding area; a data holding area reading instruction signal DHBR for reading information on the data holding block area; and a software reset signal SFRST for setting the internal circuitry to the initial state.

Each of the power down mode, software reset mode, and data holding area designation designates a state related to the standby status of the semiconductor memory device. In the case of holding the semiconductor memory device in the standby status for a long period, data in a data holding area is held by specifying the data holding area. When the power down mode is set, data is not held.

The internal mode designating signals outputted from command setting circuit 49 correspond to mode setting signal MD shown in FIG. 1.

Figure 9:
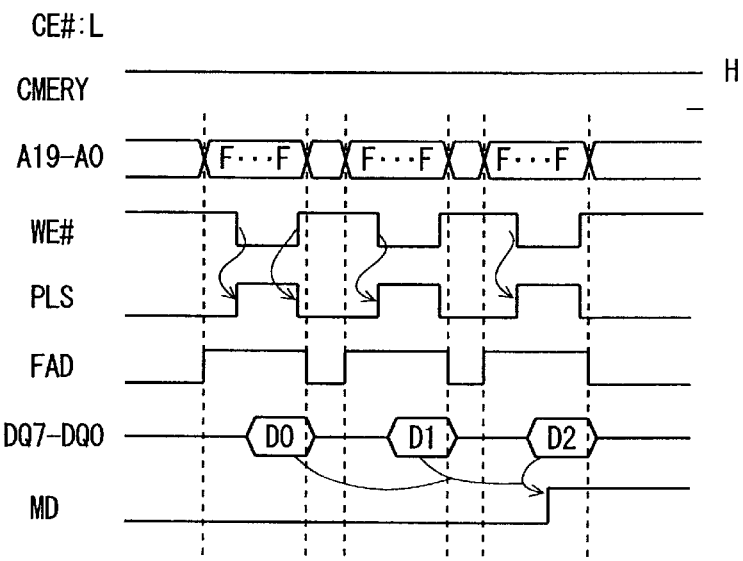
FIG. 9 is a timing chart representing operation of the mode decoding circuit shown in FIG. 8.

FIG. 9 is a timing chart representing an operation of mode decoding circuit 32 shown in FIG. 8. Referring to the timing chart of FIG. 9, the operation of mode decoding circuit 32 shown in FIG. 8 will be briefly described below.

In FIG. 9, an example is shown in which a command for designating an operation mode consists of data D0 to D2 of three bytes.

In the command mode, command mode entry signal CMERY is at the H level. In command standby stage ST4, final address FFFFFH is designated and data is written. When write enable signal WE# is activated, an output signal of NAND circuit 42 shown in FIG. 8 goes low and accordingly, an output signal of NAND circuit 44 goes high. Since command mode entry signal CMERY is at the H level, pulse signal PLS from AND circuit 45 goes high. Shift register 47 performs shifting operation in accordance with pulse signal PLS and takes in data bits DQ7 to DQ0 supplied from bus switching circuit 46.

When command mode entry signal CMERY is activated, bus switching circuit 46 connects input/output buffer 40 to shift register 47, and the internal write/read circuitry is isolated from input/output buffer 40. That is, upon the command mode entry, data is not written/read to/from a memory cell. As stated above, this can be easily implemented by simply stopping the operation of internal control signal generating circuit 12 shown in FIG. 1 in accordance with command mode entry signal CMERY.

When the final address is designated and data is written a plurality of number of times, data D0, D1, and D2 are stored in shift register 47. Command decoder 48 normally decodes data stored in shift register 47. According to the data patterns of data D0 to D2, command decoder 48 determines that the command for designating a specific operation mode is supplied and drives a corresponding internal mode instruction signal to the H level.

When pulse signal PLS is applied and address decode signal FAD indicating that the final address is specified goes high, command setting circuit 49 drives the corresponding internal mode designating signal to the active state of the H level in accordance with the output signal of command decoder 48.

Also in the case where the data reading operation is designated when the command mode is set, pulse signal PLS is made active. In this case, shift register 47 performs shifting operation and takes in and transfers data applied via bus switching circuit 46. In this case, therefore, for a command other than the data holding area reading command, data quite different from the command is taken in shift register 47, and an output signal of command decoder 48 maintains an inactive state.

Pulse signal PLS is generated also in the data read mode for the purpose that when data holding block reading mode DHBR is designated, the read mode is designated and the data holding block specifying signal stored in a not-shown register is read via the output buffer circuit. Through the shifting operation of shift register 47, the data holding area read command is supplied to command decoder 48, and data holding area read instruction signal DHBR goes high. Responsively, the data stored in the register for storing the data holding area specifying data is read out.

Figure 10:
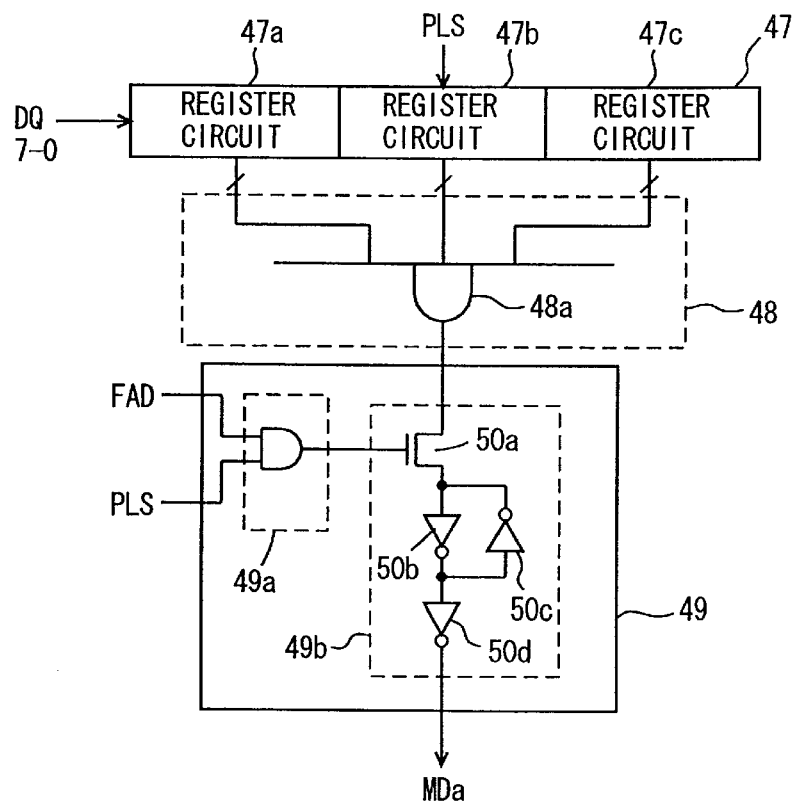
FIG. 10 is a diagram showing a specific example of the configurations of a shift register, a command decoder, and a command setting circuit shown in FIG. 8.

FIG. 10 is a diagram showing an example of the specific configuration of shift register 47, command decoder 48, and command setting circuit 49 shown in FIG. 8. In FIG. 10, shift register 47 includes register circuits 47a to 47c each having a 1-byte register stage. Register circuits 47a to 47c perform shifting operation on a byte basis in accordance with pulse signal PLS. Accordingly, a group of data bits DQ7 to DQ0 from bus switching circuit 46 shown in FIG. 8 is sequentially transferred through register circuits 47a, 47b, and 47c in accordance with pulse signal PLS.

Command decoder 48 includes a decoding circuit 48a provided in correspondence with each operation mode designate signal. In FIG. 10, decoding circuit 48a receives data bits of register circuits 47a to 47c and sets its output signal to the H level when the received data bits are in a specific predetermined combination in logic level. Depending on an operation mode to be designated, the command is constructed by byte data, or the command is constructed by two-byte data. According to the configuration of each command, the decoding circuit is provided.

Command setting circuit 49 includes a trigger signal generating circuit 49a for generating a trigger signal in accordance with decode signal FAD indicative of designation of the final address and pulse signal PLS; and a latch circuit 49b for taking in and latching an output signal of corresponding command decoding circuit 48a in accordance with an output signal of trigger signal generating circuit 49a. Trigger signal generating circuit 49a is formed of, for example, an AND circuit, and outputs an H level signal when both decode signal FAD and pulse signal PLS are at the H level.

Latch circuit 49b includes: a transfer gate 50a which is made conductive in accordance with an output signal of trigger signal generating circuit 49a; an inverter 50b for inverting a corresponding command decode signal supplied via transfer gate 50a; an inverter 50d for inverting an output signal of inverter 50b to generate a mode designation signal MDa; and an inverter 50c for inverting an output signal of inverter 50b and transmitting the inverted signal to the input of inverter 50b.

When the output signal of trigger signal generating circuit 49a goes high, latch circuit 49b enters a through state, takes in and latches a corresponding output signal of command decoding circuit 48a, and drives mode designation signal MDa to the H level or an active state. Consequently, by providing latch circuit 49b for each of mode designation signals EXIT, PWD, WKU, BHBS, DHBR, and SFRST, each mode designation signal can be generate to set a designated operation mode.

Even by providing trigger signal generating circuit 49a commonly for the plurality of mode designating signals, two operation modes are not executed simultaneously, and therefore, there causes no problem. For example, in order to complete the power down mode, it is necessary to supply the exit command to activate exit mode instructing signal EXT. In this case, power down mode instructing signal PWD is made inactive. Thus, no problem occurs.

It is also possible to dispose a flip flop in correspondence with each command and to set the flip flop when a corresponding command is supplied. For example, the flip lop has only to be reset by applying the wake up command, exit command, or reset command, or by designating the end of the command mode.

Specifically, in command setting circuit 49 shown in FIG. 10, in place of latch circuit 49b, a set/reset flip flop may be used. For example, when the exit command or software reset command SFRST is supplied, command setting circuit 49 is reset. It is sufficient to reset the flip flop when an appropriate command is applied in accordance with the operation mode designated by the command setting circuit.

Figure 11:
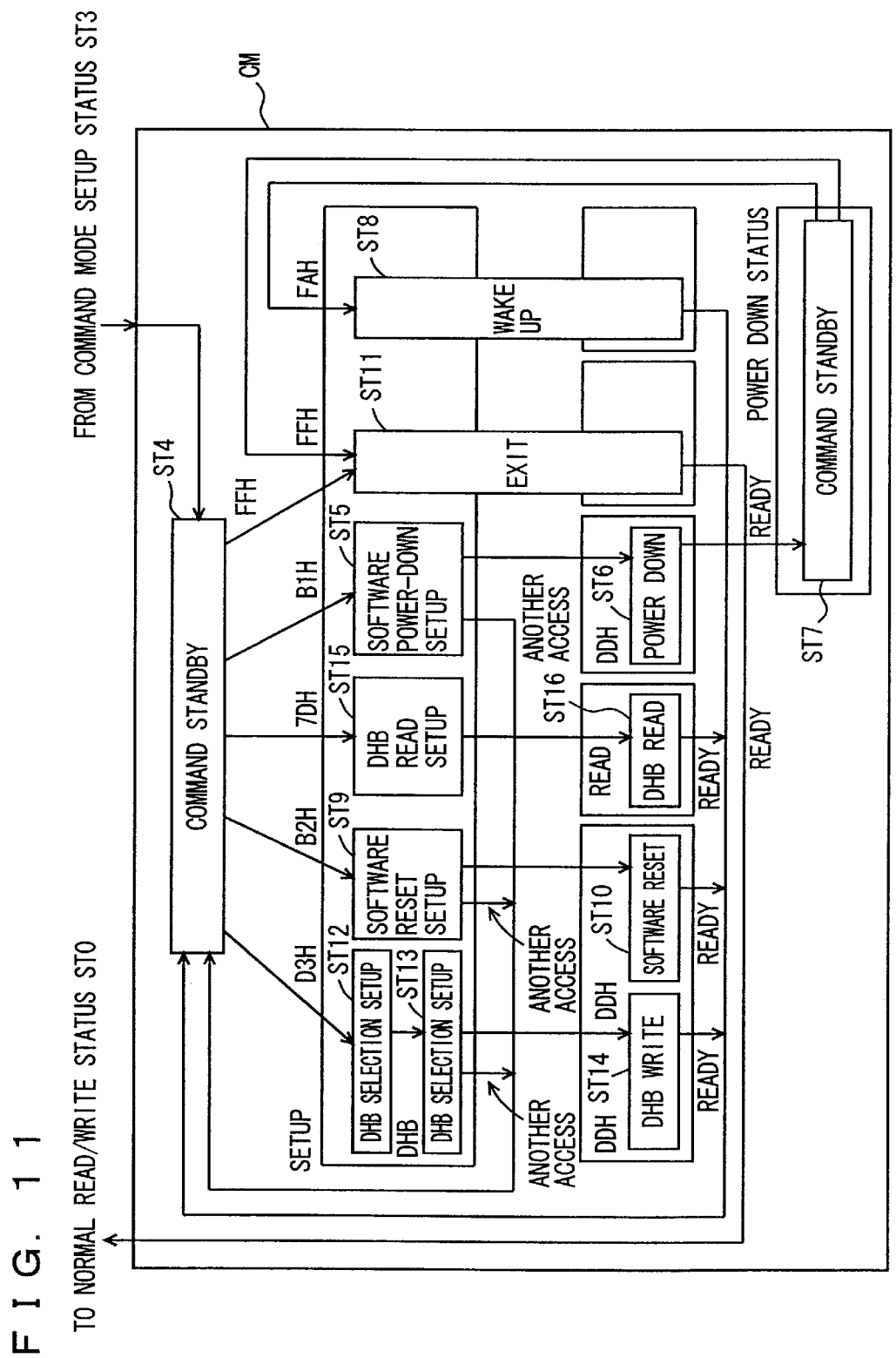
FIG. 11 is a diagram showing status transition in a command mode of the semiconductor memory device according to the invention.

FIG. 11 is a diagram showing transition of the internal status upon setting of the command mode. Since a command is set by designating the operation of writing data to the final address FFFFFH, only data constructing a command is shown in FIG. 11. In the case of designating the final address and writing data B1H in command standby status ST4, the status shifts to software power down setup status ST5. Since it is in the command mode, data is not written to the memory cell array (memory array is held in the standby state).

Subsequently, when the final address is designated again and predetermined data D0H is written, the status shifts to a software power down status ST6. In software power down status ST6, power down instructing signal PWD from the command setting circuit becomes active and the power supply to the internal circuitry is shut off. When the power down operation is completed, the status shifts to a command standby status ST7 for waiting for a next command in the power down state of the internal circuitry. Command standby status ST7 is a power down status in which the power supply to circuits except for mode control circuit 22 (including the input buffer circuit) shown in FIG. 1 is shut off.

In the case of writing data FAH with the final address designated in command standby status ST7, the status shifts to a wake up status ST8. In the wake up status ST8, the power down is completed and the power is supplied to the internal circuitry to which the power supply has been shut off. After recovery of the power supply, the status shifts from wake up status ST8 to command standby status ST4 for waiting for a next command. The reason why the status does not shift from wake up status ST8 to normal read/write status ST0 after completion of the wake up operation is that the internal state has to be initialized and a command for this initialization purpose has to be executed.

In the case of designating the final address for writing data D2H in command standby status ST4, the status shifts to a software reset/setup status ST9. When data D0H is written with the final address designated again in software reset/setup status ST9, the status shifts to a software reset status ST10. In the software reset status ST10, the internal, peripheral circuitry is initialized. After completion of initialization of the internal status in software resetting status ST10, the status shifts again to command standby status ST4. In software reset status ST10, in a manner similar to the power-on or power-up, an internal node is initialized to a predetermined potential level in accordance with a power-on detection signal. In the initialization, a dummy cycle may be performed a predetermined number of times to operate the internal circuitry, thereby setting the internal state to the standby state with reliability as performed in a normal DRAM.

When the final address is designated and data FFH is written in command standby status ST4, the status shifts to an exit status ST11. In the exit status ST11, reset signal RST shown in FIG. 5A is reset, command mode entry signal CMERY becomes inactive, command mode CM is completed, and the status shifts to normal read/write status ST0. Accordingly, normal data writing/reading operation can be performed subsequently. At this time, the command mode can be set up again.

On the other hand, in the case where the final address is designated and data FFH is written in the command standby status ST7, the status shifts again to exit status ST11, the power down status is completed, and the status shifts to normal read/write status ST0. In this case, the internal state is not initialized, so that software reset has to be performed.

On the other hand, when the final address is designated and data D3H is written in command standby status ST4, the status shifts to a DHB selection setup status ST12. By designating the final address again and setting data DHB for designating the data holding block area in DHB selection setup status ST12, the status shifts to a DHB selection setup status ST13.

When the final address is designated again and data D0H is written in the status ST13, the data holding block area is set by data DHB, and the status shifts to a DHB write status ST14. In status ST14, data for specifying the data holding area is written and the data holding area is designated.

After completion of setting the data holding block in status ST14, the status shifts again to command standby status ST4.

On the other hand, when the final address is designated and data 7DH is written in command standby status ST4, the status shifts to a DHB read setup status ST15. In DHB read setup status ST15, the status of reading the contents in the data holding block is set. When the data reading operation is executed in the status ST15, the status shifts to a DHB read status ST16 where each data holding block information is read out. After completion of the DHB read status ST16, the status shifts again to command standby status ST4. By performing the DHB reading operation, a memory block which is designated to hold data can be confirmed.

In the setup statuses, in the case of making an access different from an access for designating an operation of writing data D0H to the final address or reading data from the final data required to set any internal status, the status shifts again to command standby status ST4.

By designating the final address externally and writing the command via a data terminal in command standby status ST4, the status can be easily shifted from the setup status to the internal command executing status. Accordingly, various operation modes of the semiconductor memory device, particularly, operation modes related to initialization can be set while maintaining the compatibility of pins with a normal SRAM. Although the command is set by using the lower byte data DQ0 to DQ7, the upper byte data DQ8 to dQ15 can be used in place of the lower byte data DQ0 to dQ7. Consequently, both setup of a command with the upper byte data and setup of a command with the lower byte data can be easily implemented according to the internal configuration.

Figure 12:
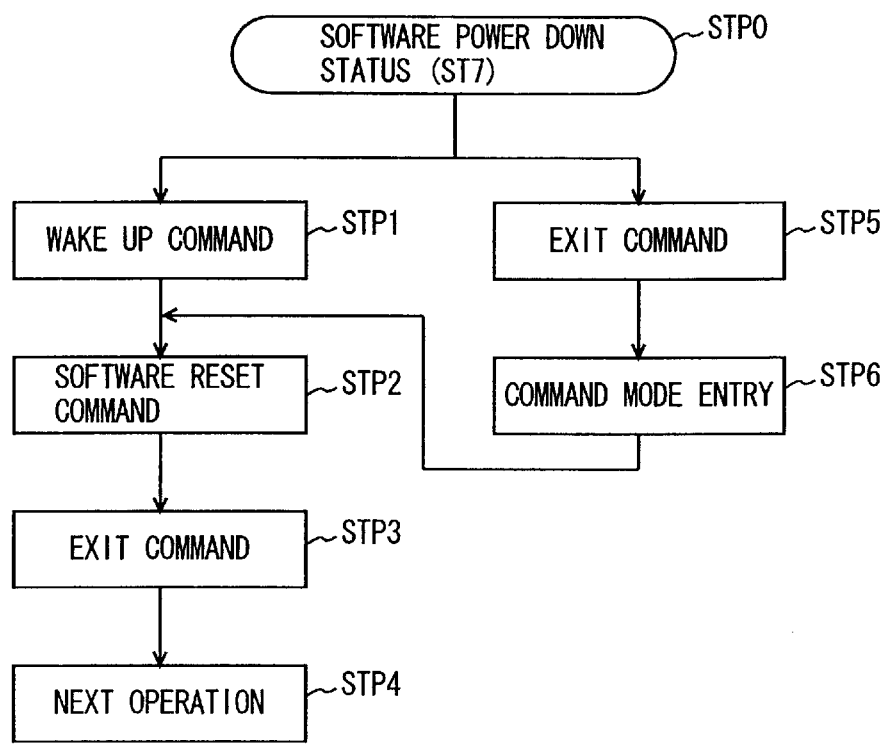
FIG. 12 is a flowchart representing a wake-up sequence of the semiconductor memory device according to the invention.

FIG. 12 is a flowchart of a wake up sequence for completing the power down mode in the status transition diagram of FIG. 11. The wake up sequence will be briefly described below.

In command standby status ST7 as shown in FIG. 11, the semiconductor memory device 1 is in a software power down status (step STP0). This status shifts through statuses ST5 and ST6 shown in FIG. 11 to execute the wake up command (step STP1). By executing the wake up command, the internal circuitry in the power down state enters a power up state (power supply voltage is supplied). The power is simply supplied and the internal state is unstable. Therefore, in order to initialize the internal states, passing through the statuses ST9 and ST10 shown in FIG. 11, the software reset command is executed (step STP2). By executing the software reset command, the internal states are initialized to predetermined states.

After initializing the internal states, the status shifts to a status ST11 shown in FIG. 11 where the exit command is executed (step STP3). By executing the exit command, the command mode is completed and the status returns to the normal write/read status ST0 shown in FIG. 7. In step STP4 for performing a subsequent operation, either a data access in the normal read/write operation or an operation of successively reading data from the final address to set the command mode again may be performed.

On the other hand, also in the case of executing the exit command in software power down status ST7 (step STP5), the command mode is completed and the power supply voltage is supplied to the internal circuitry in the power down state. In the case of executing the exit command, simply, the command mode is completed, the power down status is released and the status shifts to normal write/read status ST0 shown in FIG. 7. Therefore, the internal state of the semiconductor memory device is unstable. Thus, the operation of successively reading data in the final address is again performed a predetermined number of times (four times) to set the command mode (step STP6). After entering the command mode, the process returns to step STP2 where the software reset command is executed, and then subsequent steps STP3 and STP4 are executed.

The shift from the power down status to power up status is made by merely executing a command, it is not required to externally set the internal states in a hardware manner via a specific pin terminal, and in addition, a special signal timing relationship is not necessary. With the terminal group used in the normal operation, through the same setting of the states of the logic levels of the signals as in the normal operation, the operation for initialization can be performed.

Figure 13:
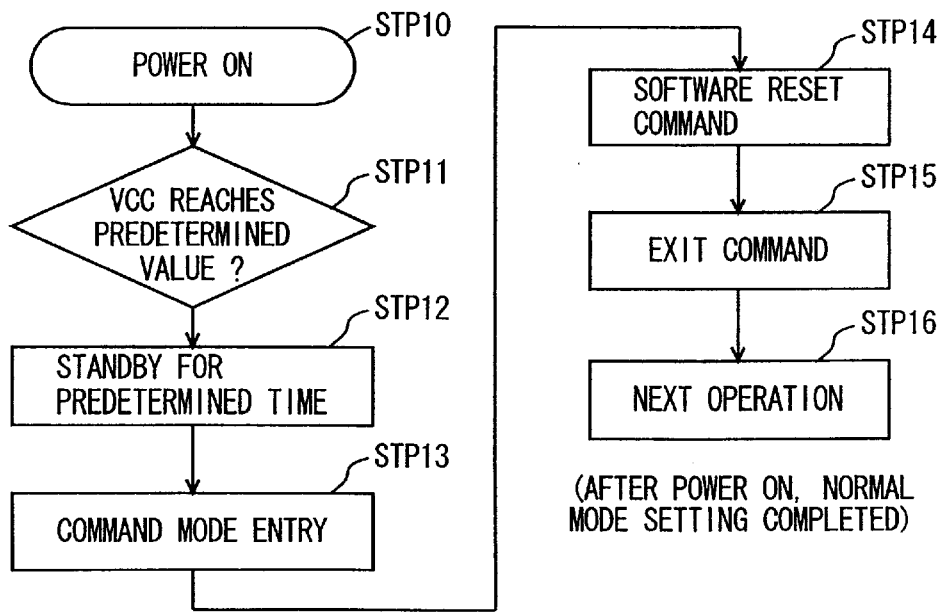
FIG. 13 is a flowchart representing a power-up sequence of the semiconductor memory device according to the invention.

FIG. 13 is a flowchart showing an operation sequence at power up. When power is up (step STP10), whether a power supply voltage VCC reaches a predetermined value or not is determined (step STP11). Whether the power supply voltage VCC reaches the predetermined level or not is detected by, for example, a power on detection signal POR output from an internal power on detecting circuit (POR detecting circuit).

When it is detected in step STP11 that the power supply voltage VCC reaches the predetermined level, the device waits until the internal state is stabilized, that is, until predetermined time of, for example, 500 µs elapses (step STP12). After elapse of the predetermined time, the command mode entry operation is executed to enter the command mode (step STP13). By the command mode entry, mode decoding circuit 32 shown in FIG. 4 enters command standby status ST4 shown in FIG. 11. In the command mode, a software reset command is executed (step STP14). By executing the software reset command, the internal state is initialized. The software reset command is executed, thereby reliably initializing the internal state also in the peripheral circuitry which does not receive power on detection signal POR.

Subsequently, the exit command is executed (step STP15) to exit the command mode and enter the normal mode where a following operation is performed (step STP16). By the step STP16, setting of the normal mode after power on is completed.

Therefore, also at initialization of the internal state after power on, the internal state can be reliably set to the initial state, using the normal signals. This holds for the case of recovery of the power supply voltage from the shut off of the power supply voltage.

Figure 14:
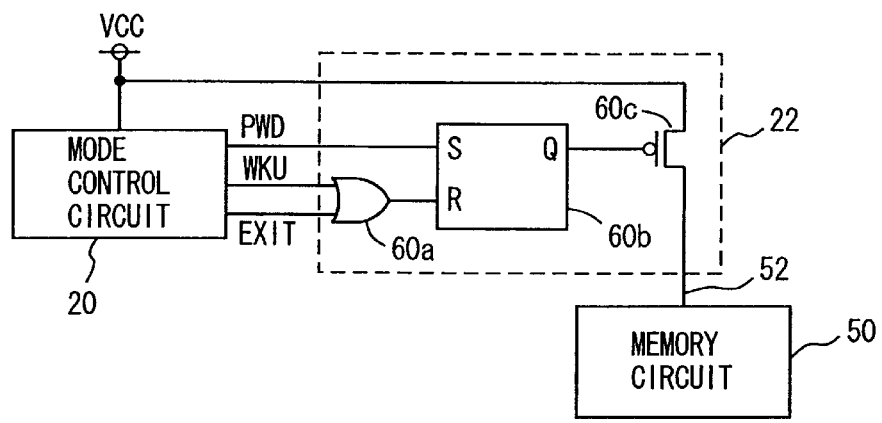
FIG. 14 is a diagram schematically showing the configuration of a portion related to power-down of a status control circuit shown in FIG. 1.

FIG. 14 is a diagram schematically showing the configuration of a portion related to the power down of status control circuit 22 shown in FIG. 1. In FIG. 14, status control circuit 22 includes: an OR circuit 60a receiving wake up instruction signal WKU and exit instruction signal EXIT from mode control circuit 20; a set/reset flip flop 60b that is set when power down instruction signal PWD from mode control circuit 20 is activated, and is reset when an output signal of OR circuit 60a goes high; and a power source transistor 60c for connecting a power supply node to a power supply line 52 of a memory circuit 50 in accordance with a signal from an output Q of set/reset flip flop 60b. Power supply transistor 60c is formed of, for example, a P-channel MOS transistor and is made non-conductive, when set/reset flip flop 60b is set, to isolate power supply line 52 of memory circuit 50 from the power supply node. Memory circuit power supply line 52 includes power supply lines provided for the peripheral circuitry and for the memory cell array in memory circuit 50, that is, a peripheral power supply line and an array power supply line.

To mode control circuit 20, power supply voltage VCC is normally supplied. To a not shown input/output circuit (input/output circuit used to designate the command mode) as well, the power supply voltage VCC is supplied also in the power down mode.

In the configuration of status control circuit 22 shown in FIG. 14, when status control circuit 22 enters the power down mode, power down instruction signal PWD goes high, set/reset flip flop 60b is set, and a signal from the output Q of the flip flop 60b goes high. Accordingly, power supply transistor 60c is made non-conductive to cut off the supply of the power supply voltage VCC to power supply line 52 for memory circuit 50. Memory circuit 50 includes memory cell array 2 shown in FIG. 1 and its peripheral circuitry.

When a signal instructing writing/reading of data is applied to mode control circuit 20, in the case where the operation of the input buffer is controlled by internal control signal generating circuit 12, the power supply voltage is also supplied to the input/output buffer circuit control unit in internal control signal generating circuit 12. The portion related to selection of row and column of the memory cell array is included in memory circuit 50 and the supply of the power supply voltage is cut off.

When the wake up command is applied, wake up instruction signal WKU goes high, an output signal of OR circuit 60a goes high, set/reset flip flop 60b is reset to raise the signal from the output Q thereof to H level, power supply transistor 60c is made conductive, and the power supply voltage VCC is supplied to memory circuit 50.

When the exit command is applied, exit instruction signal EXIT goes high, an output signal of OR circuit 60a goes high, and similarly, set/reset flip flop 60b is reset. Accordingly, power supply transistor 60c is made conductive, and accordingly the memory power supply line 52 is connected to the power supply terminal and receives the power supply voltage VCC. A predetermined time is necessary until the voltage of memory power supply line 52 is stabilized and until the state of the internal circuitry is stabilized.

Figure 15:
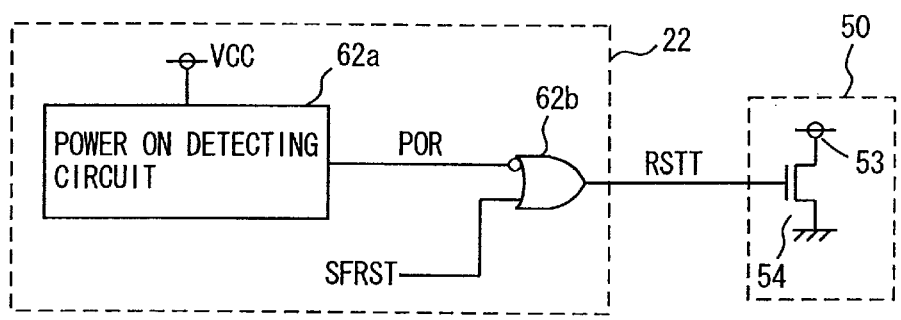
FIG. 15 is a diagram schematically showing the configuration of a portion related to software resetting of the status control circuit as shown in FIG. 1.

FIG. 15 is a diagram schematically showing the configuration of a portion related to software reset in status control circuit 22 shown in FIG. 1. In FIG. 15, status control circuit 22 includes: a power on detecting circuit 62a for detecting whether the power supply voltage VCC reaches a predetermined voltage level or not; and a gate circuit. 62b receiving power on detection signal POR from power on detecting circuit 62a and software reset signal SFRST and generating a reset signal RSTT. Gate circuit 62b drives reset signal RSTT to the H level when power on detection signal POR goes low or software reset signal SFRST goes high.

In memory circuit 50, a predetermined internal node 53 is provided with a resetting transistor 54. According to reset signal RSTT, predetermined internal node 53 is set to the ground voltage level by the resetting transistor 54. Therefore, when internal node 53 is reset to the power supply voltage VCC level upon the initialization, a P-channel MOS transistor (insulated gate field effect transistor) is used as the resetting transistor and the predetermined internal node 53 is connected to the power supply node when the resetting P MOS transistor is made conductive.

It is also possible to internally generate, according to software reset signal SFRST, an array activating signal a predetermined number of times and perform a dummy cycle of executing row selecting operation a predetermined number of times, thereby initializing the internal state.

Figure 16:
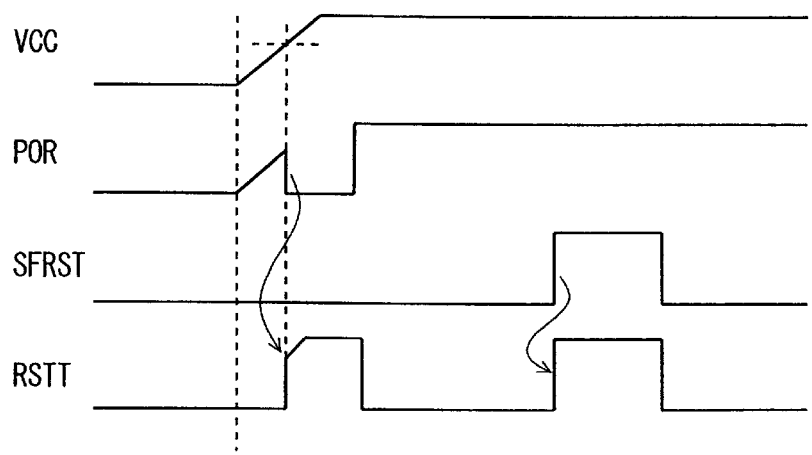
FIG. 16 is a signal waveform diagram representing operation of the status control circuit as shown in FIG. 15.

FIG. 16 is a signal waveform diagram representing the operation of status control circuit 22 shown in FIG. 15. Referring to the signal waveform diagram shown in FIG. 16, the operation of status control circuit 22 shown in FIG. 15 will be briefly described below. After power is on or at the time of recovery from power cutting off, the power supply voltage VCC is supplied and the voltage level thereof increases. When the power supply voltage VCC reaches the predetermined voltage level, power on detection signal POR from power on detecting circuit 62a becomes the L level for a predetermined period of time and, accordingly, reset signal RSTT from gate circuit 62b goes high. Consequently, at power on or recovery from power down, internal node 53 is reset to the predetermined voltage level.

When the voltage level of internal node 53 is stabilized, software reset signal SFRST is driven to the active state in accordance with the software reset command. In this case as well, reset signal RSTT is set to the high level by gate circuit 62b, and the predetermined internal node 53 is initialized to the ground voltage level in memory circuit 50.

By using software reset command (reset instruction signal) SFRST, the power supply is cut off internally while the power supply voltage is continuously supplied externally in the power down mode, the internal node can be reliably reset without using power on detection signal POR. By carrying out the software resetting after the voltage level of the internal node is stabilized, the internal node can be initialized to a predetermined voltage level with reliability. Consequently, initialization of the internal node in the standby status and initialization after completion of the standby status can be carried out with reliability.

In the case where the semiconductor memory device is held in the standby status for a long period, the semiconductor memory device is set in a data holding mode, and storage data is internally refreshed according to a self refresh mode at predetermined intervals. By specifying the data holding area in the refresh, only a necessary area is refreshed, and therefore, the number of times of refreshing is reduced to reduce the current consumption in the data holding mode.

Figure 17:
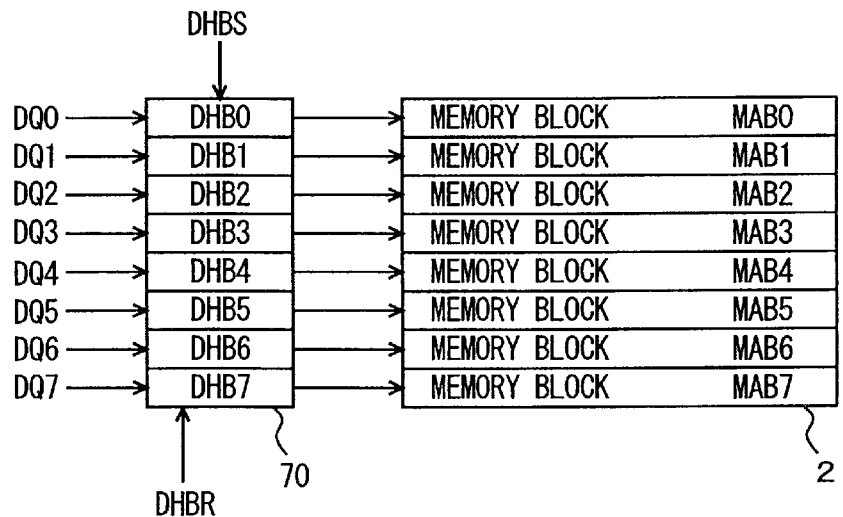
FIG. 17 is a diagram schematically showing the configuration of a memory cell array in the semiconductor memory device according to the invention.

FIG. 17 is a diagram schematically showing the correspondence relationship between the memory cell array and data holding block specifying data. In FIG. 17, memory cell array 2 is divided into eight memory array blocks MAB0 to MAB7. Memory blocks MAB0 to MAB7 are designated by data holding block specifying bits DHB0 to DHB7, respectively. Data holding block specifying bits DHB0 to DHB7 are set in a data holding register 70 in accordance with external data DQ0 to DQ7 when a DHB selection mode is set.

In a DHB reading mode, data holding block specifying bits DHB0 to DHB7 stored in data holding register 70 are read out externally. Specifically, when a DHB selection command is supplied and a DHB selection signal DHBS from command setting circuit 49 shown in FIG. 8 goes high, data holding block specifying bits DQ0 to DQ7 stored in shift register 47 are stored in data holding register 70. When a DHB read command is supplied and a DHB read signal DHBR from command setting circuit 49 shown in FIG. 8 is made active at the H level, the data stored in data holding register 70 is read out and supplied to an output buffer via the data bus switching circuit shown in FIG. 1, and output externally.

Data holding register 70 may be constructed of a latch circuit provided for each data holding specifying bit or a set/reset flip flop disposed in correspondence with each data holding block specifying bit.

The data stored in data holding register 70 is supplied to a refresh control circuit included in internal control signal generating circuit 12 shown in FIG. 1 and an area to be refreshed is set.

In the case of specifying an area for holding data through the refreshing operation, according to a manner (specification) of setting the data holding area, a method of specifying the refresh address area varies. An example of a method of capable of setting whether data is held or not for each of memory blocks MAB0 to MAB7 will be described below.

Figure 18:
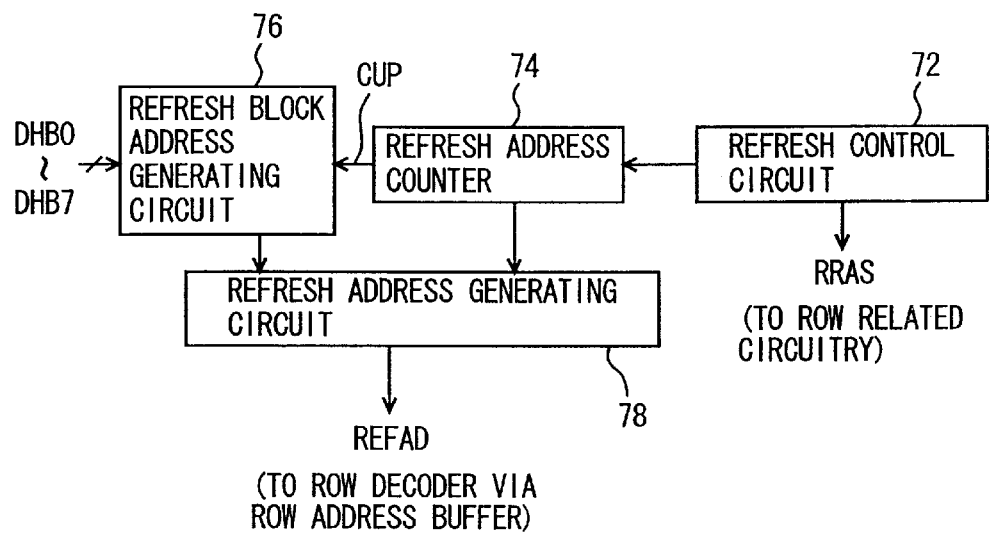
FIG. 18 is a diagram schematically showing the configuration of a portion related to refreshing in an internal control signal generating circuit shown in FIG. 1.

FIG. 18 is a diagram schematically showing the configuration of a refresh control section included in internal control signal generating circuit 12 shown in FIG. 1. In FIG. 18, the refresh control section includes: a refresh control circuit 72 for generating a refresh activating signal RRAS at predetermined intervals; a refresh address counter 74 having a count value thereof sequentially updated under control of refresh control circuit 72; a refresh block address generating circuit 76 for generating a refresh block address for specifying a refresh block in accordance with data holding area data (data holding block specifying bits) DHB0 to DHB7 and a count up signal CUP from refresh address counter 74; and a refresh address generating circuit 78 for generating a refresh address REFAD in accordance with output bits of refresh address counter 74 and output bits of refresh block address generating circuit 76.

Refresh activating signal RRAS from refresh control circuit 72 is supplied to row circuitry related to an operation of selecting a row such as a row decoder, a sense amplifier, and a row address buffer. Refresh address counter 74 generates an in-block address for specifying a word line in a memory block, that is, a refresh word line address.

The count value of refresh counter 74 is updated each time the refreshing operation is completed. After completion of operation of refreshing data stored in memory cells in a memory block, refresh address counter 74 generates count up signal CUP.

Refresh block address generating circuit 76 designates the start refresh block address in accordance with data holding area data (data holding block specifying bits) DHB0 to DHB7, performs shifting operation in accordance with count up signal CUP, and sequentially generates a refresh block address for specifying the data holding block. In the shifting operation, according to refresh block specifying bits DHB0 to DHB7, the shifting operation bypasses memory blocks different from the data holding area.

Therefore, when data holding block specifying bits DHB0 to DHB7 are "1", for example, and the corresponding memory blocks are each designated as a data holding block, refresh block address generating circuit 76 sequentially generates a block address for specifying a memory block as the data holding area.

Refresh address generating circuit 78 receives, for adjusting timings, the refresh word line address from refresh address counter 74 and the refresh block address from refresh block address generating circuit 76 and generates refresh address REFAD. Refresh address REFAD is supplied to the row decoder via the row address buffer.

Figure 19:
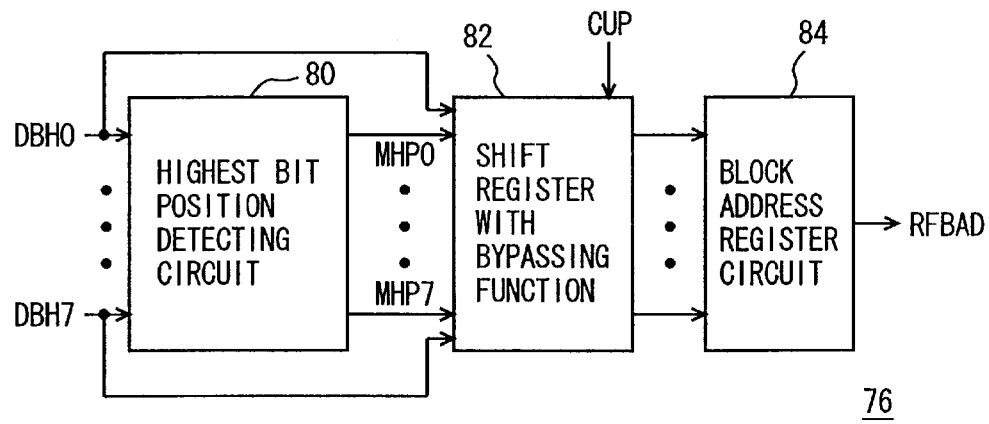
FIG. 19 is a diagram schematically showing the configuration of a refresh block address generating circuit shown in FIG. 18.

FIG. 19 is a diagram showing an example of the configuration of refresh block address generating circuit 76 shown in FIG. 18. In FIG. 19, refresh block address generating circuit 76 includes: a highest bit position detecting circuit 80 for detecting the position of the highest bit of bits "1" in data holding block specifying bits DBH0 to DBH7; a shift register 82 with a bypassing function which includes register stages corresponding to memory blocks, initialized by highest bit position detecting circuit 80, and performs shifting operation in accordance with the count up signal and data holding area bits DBH0 to DBH7; and a block address register circuit 84 for sequentially selecting a block address in accordance with an output signal of shift register 82 with the bypassing function and generating a refresh block address RFBAD. In shift register 82 with the bypassing function, an output of the final stage is fed back to the input of the first register stage so as to perform shifting operation in a ring.

Highest bit position detecting circuit 80 is formed of a normal detecting circuit for detecting the position of the highest bit of bits "1" in bits DBH0 to DBH7. When bits DBH0 to DBH7 are "1", the corresponding memory block are each designated as a data holding area.

Shift register 82 with the bypassing function has register stages disposed in correspondence with the memory blocks. The register stage corresponding to the memory block in the highest position in the data holding blocks is initially set to "1". Shift register 82 with the bypassing function selectively executes the shifting operation in accordance with the respective bits DBH0 to DBH7. Specifically, when a corresponding memory block is not designated as a data holding area, the corresponding register stage is skipped and the shifting operation is executed between the register stages corresponding to the memory blocks designated as data holding areas.

Block address register circuit 84 stores a block address (of three bits) corresponding to a memory block and outputs the corresponding block address when an output signal from shift register 82 with the bypassing function goes high.

Figure 20:
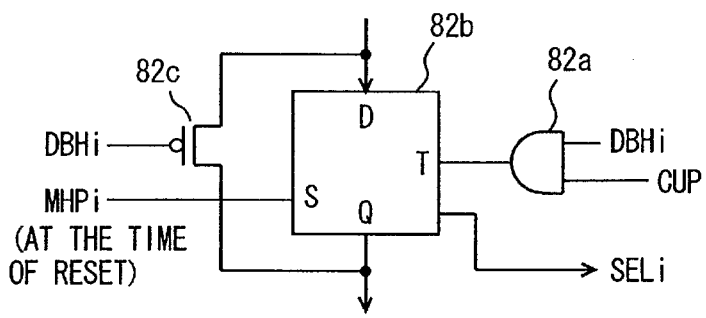
FIG. 20 is a diagram schematically showing the configuration of a register stage in a shift register with bypassing function shown in FIG. 19.

FIG. 20 is a diagram schematically showing the configuration of one of the register stages of shift register 82 with the bypassing function.

An output of the final register stage in shift register 82 with the bypassing function is fed back to the first register stage.

In FIG. 20, the register stage includes: an AND circuit 82*a* receiving data holding block specifying bit DBHi and count up signal CUP; a latch circuit 82*b* for taking in data supplied from a preceding register stage and transferring the data to a subsequent register stage by performing transferring operation using an output signal of AND circuit 82*a* as a clock signal; and a transfer gate 82*c* for short-circuiting the input and output of latch circuit 82*b* in accordance with data holding block specifying bit DBHi. Here, the reference "i" denotes any natural number from 0 to 7 and indicates a memory block MBi.

The internal state of latch circuit 82*b* is set in accordance with a corresponding highest bit position detection signal MHPi from highest bit position detection circuit 80, and a corresponding selection signal SELi is set to H level when the latch circuit 82*b* is set. When data holding area bit DBHi is at the H level ("1"), transfer gate 82*c* is in the non-conductive state, and AND circuit 82*a* generates and applies an output signal to the latch circuit in accordance with count up signal CUP. In this case, therefore, latch circuit 82*b* performs operation of transferring the signal. On the other hand, when data holding block specifying bit DBHi is "0" (L level), transfer gate 82*c* is rendered conductive and an output signal of AND circuit 82*a* is kept at the L level. Thus, latch circuit 82*b* is bypassed by transfer gate 82*c* and does not perform shifting operation. In this case, corresponding highest bit position detection signal MHPi is at the L level and selection signal SELi normally is kept at the L level.

Consequently, the block address can be activated only for the data holding area specified by data holding block specifying bits DBH0 to DBH7.

In the case of initializing shift register 82 with the bypassing function in accordance with the output signal of highest bit position detection circuit 80, the initialization is executed in software resetting operation or DBH writing operation. Specifically, a one-shot pulse is generated when software resetting is performed or a DHB bit is written, and shift register 82 with the bypassing function is initialized in accordance with output signal MHPi of highest bit position detecting circuit 80.

Figure 21:
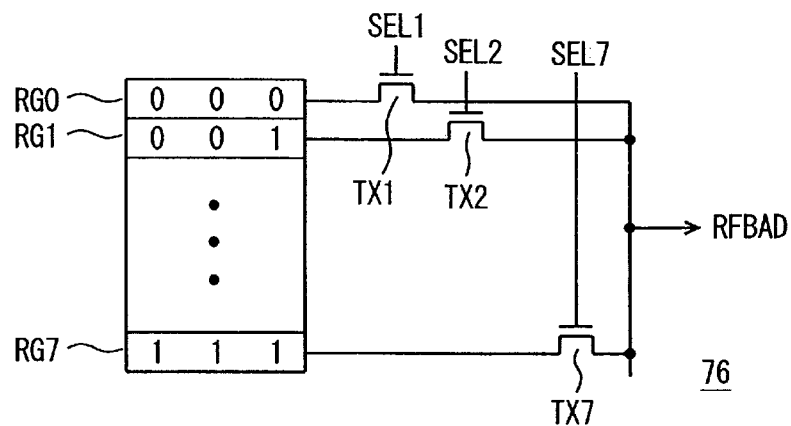
FIG. 21 is a diagram schematically showing the configuration of a block address register circuit shown in FIG. 19.

FIG. 21 is a diagram showing an example of the configuration of block address register circuit 84 shown in FIG. 19. In FIG. 21, block address register circuit 84 includes: register circuits RG0 to RG7 for storing block addresses of memory blocks MB0 to MB7, respectively; and selection gates TX1 to TX7 for selecting output signals of register circuits RG0 to RG7 in accordance with selection signals SEL1 to SEL7 from shift register 82 with the bypassing function and generating a refresh block address RFBAD. Selection gates TX1 to TX7 are provided in correspondence with register circuits RG0 to RG7, respectively. One of selection signals SEL1 to SEL7 is maintained in an active state and one of the block addresses stored in register circuits RG0 to RG7 is selected as a refresh block address.

In the configuration described above, the refresh block address is generated by block address register circuit 84 and supplied via the row address buffer to the row decoder where decoding operation is performed on the refresh address. However, each of selection signals SEL1 to SEL7 may be used as a memory row block selection signal. Specifically, such a configuration may be employed that in place of the row block selection signal for selecting a memory block in output signals from the row decoder, selection signals SEL1 to SEL7 are used as refreshing row block selection signals and decoding operation for selecting a refresh row in the selected memory row block is performed.

Second Embodiment

Figure 22:
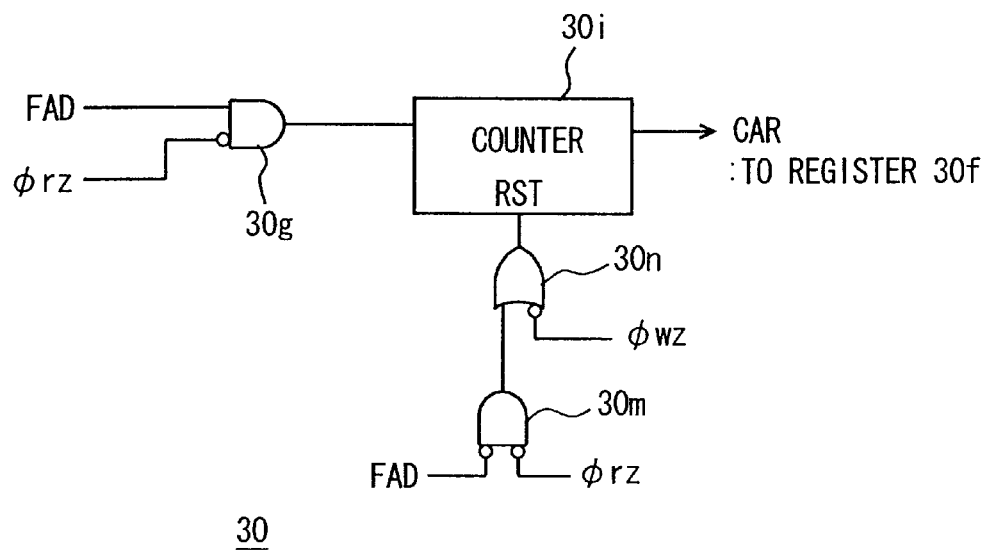
FIG. 22 is a diagram schematically showing the configuration of a main portion of a command mode detecting circuit according to a second embodiment of the invention.

FIG. 22 is a diagram schematically showing the configuration of a main portion of a second embodiment of the invention. In FIG. 22, the configuration of a main portion of command mode detecting circuit 30 shown in FIG. 5A is shown.

In command mode detecting circuit 30 shown in FIG. 22, a 2-bit counter 30*i* is provided in place of shift register 30*b* shown in FIG. 5A. Counter 30*i* counts output signals of a gate circuit 30*g* receiving the decode signal FAD and the read mode instruction signal φrz. A gate circuit 30*m* receiving decode signal FAD and read instruction signal φrz and a gate circuit 30*n* receiving an output signal of gate circuit 30*m* and write mode instruction signal φwz are provided in order to reset the counter 30*i*.

Gate circuit 30*g* outputs an H level signal when decode signal FAD is at the H level and read instruction signal φrz is at the L level. That is, gate circuit 30*g* detects that a read access is made to the final address.

Gate circuit 30*m* outputs an H level signal when decode signal FAD is at the L level and read instruction signal is at the L level. That is, gate circuit 30*m* outputs a H level signal when a read access is made to an address other than the final address.

Gate circuit 30*n* outputs an H level signal to reset the counter 30*i* when an output signal of gate circuit 30*m* goes high or write instruction signal φwz goes low. When data is read/written from/to an address other than the final address, the count value of counter 30*i* is reset.

A carry bit CAR of counter 30$i$ is stored in register circuit 30$f$ (flip flop) shown in FIG. 5A.

In the configuration shown in FIG. 22, gate circuit 30$g$ detects a read access to the final address in accordance with decode signal FAD and read mode instruction signal $\phi$rz, and outputs an H level signal when the read access is made to the final address. Counter 30$i$ counts the rising of an output signal of gate circuit 30$g$. That is, counter 30$i$ counts the number of times of read accesses performed successively to the final address.

On the other hand, in data reading operation, when decode signal FAD is at the L level, an output signal of gate circuit 30$n$ goes high and counter 30$i$ is reset. In the case where data writing operation is performed, write mode instruction signal $\phi$wz goes low, and counter 30$i$ is similarly reset by gate circuit 30$n$.

When the final address is successively accessed for reading data a predetermined number of times, counter 30$i$ sets carry bit CAR to the H level, register (flip flop) 30$f$ is set, and the command mode is set.

In the case of the configuration shown in FIG. 22, counter 30$i$ can be constructed of two stages of D latches, so that the circuit occupying area can be reduced as compared with the configuration using the data register.

Other Embodiments

In the foregoing description, data in the final address is read four times successively to enter the command mode. In this case, the data of the final address is merely read out externally, and is not destructed. However, in the case where data stored in the final address is allowed to be destructed, the read and write modes may be appropriately combined to perform the read and write modes a predetermined number of times for the operation of setting the command mode. It is merely required to perform an operation sequence different from the operation sequence executed in the normal operation mode.

The specific address is not limited to the final address, but may be any address such as a start address or an intermediate address. Since the frequency of using the final address in the normal operation mode is low, by accessing an address of low access frequency a predetermined number of times successively, the command mode entry mode and the normal operation mode can be easily and reliably discriminated from each other.

The semiconductor memory device may be a semiconductor memory device for storing 1-bit data by two DRAM cells. Specifically, complementary memory cell data are read out on a pair of bit lines, and a read voltage between the bit lines is set to a voltage twice as high as that in the case of using a single memory cell for storing 1-bit data. In this case, a refresh interval can be made longer.

For setting the command mode, in place of the sequence of making an access for reading or writing with the final address designated, any operation sequence which is not used in the normal operation mode may be used. Specifically, a sequence of successively reading or writing data with a specific address signal and a specific data bit set in combination to a predetermined state may be used for a command mode entry mode.

As described above, according to the present invention, a specific operation mode is designated through a sequence which is not used in the normal operation mode. Consequently, it is unnecessary to provide a new pin terminal for designating the specific operation mode. Thus, an SRAM alternative semiconductor memory device capable of maintaining compatibility of pins with a conventional SRAM can be implemented.

Although the present invention has been described and shown in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    mode detecting circuitry for detecting that a predetermined set of external signals are applied in a combination of specific logic states successively a plurality of times; and
    mode setting circuitry for setting a specific mode in response to a detection signal from said mode detecting circuitry.

2. The semiconductor memory device according to claim 1, wherein said predetermined set of external signals includes an address signal.

3. The semiconductor memory device according to claim 2 wherein said address signal comprises a multiple of bits, and said combination of specific logic states is a combination of states of the multiple bits of said address signal designating a specific address.

4. The semiconductor memory device according to claim 3, wherein said specific address is a final address.

5. The semiconductor memory device according to claim 2, wherein said predetermined set of external signals further includes an operation mode instruction signal.

6. The semiconductor memory device according to claim 5, wherein said operation mode instruction signal is a read instruction signal for instructing a data reading operation.

7. The semiconductor memory device according to claim 1, further comprising mode circuitry made operable in response to an output signal of said mode setting circuitry in said specific mode, said mode circuitry generating, when a prescribed external signal in said external signals satisfies a predetermined condition, a signal for designating an internal state in accordance with other signals out of said external signals when made operable.

8. A semiconductor memory device accessed in accordance with external signals in a normal operation mode, comprising:
    a command decoder made active in a specific mode, for decoding predetermined external signals out of said external signals and generating a signal for setting an internal state to a predetermined state when activated, said signal generated by said command decoder being a signal for designating an operation related to a standby status of said semiconductor memory device, wherein
    said command decoder activates either of a power down mode of designating cutting off of a supply of an internal power supply voltage, a wake up mode for completing said power down mode, a reset mode for setting the internal state into an initial state, a mode of designating a data holding area in a data holding mode, and an exit mode for completing said specific mode in accordance with said predetermined external signals.

9. The semiconductor memory device according to claim 7, wherein said specific mode is designated when an access in a sequence different from an access sequence performed in said normal operation mode is made.

10. The semiconductor memory device according to claim 7, wherein said specific mode is designated when a predetermined address is accessed a predetermined number of times successively.

11. A semiconductor memory device accessed in accordance with external signals in a normal operation mode, comprising:

mode detecting circuitry for detecting that a predetermined set of external signals out of said external signals are applied in a combination of specific logic states a plurality of times successively;

mode setting circuitry for setting a specific mode in response to a detection signal of said mode detecting circuitry; and mode circuitry rendered operable in said specific mode in accordance with an output signal of said mode setting circuitry.

12. The semiconductor memory device according to claim 11, wherein said predetermined set of external signals includes an address signal, and said mode detecting circuitry detects that said address signal is applied in a state of designating a specific address said predetermined number of times.

13. The semiconductor memory device according to claim 11, wherein said mode circuitry is a command decoding circuit for decoding a command constructed of said predetermined set of external signals and generating an operation mode instruction signal in accordance with a result of decoding, and said command decoding circuit activates either of a power down mode of designating cutting off of supply of an internal power supply voltage, a wake up mode for completing said power down mode, a reset mode for setting an internal state to an initial state, a mode of designating a data holding area in a data holding mode, and an exit mode for completing said specific mode.

14. The semiconductor memory device according to claim 11, wherein said mode circuitry generates a signal of designating an internal state in accordance with an externally applied signal in said specific mode and said semiconductor memory device further comprises an internal status control circuit for setting an internal state to a state designated by an output signal of said mode circuitry in accordance with the output signal of said mode circuitry.

15. The semiconductor memory device according to claim 14, wherein said mode circuitry generates, when a prescribed external signal in said external signals satisfies a predetermined condition, a signal for designating said internal state in accordance with other signals out of said external signals.

16. The semiconductor memory device according to claim 11, wherein said mode circuitry generates, when a prescribed external signal in said external signals satisfies a predetermined condition, a signal for designating an internal state in accordance with other signals out of said external signals when made operable.

* * * * *

UNITED STATES PATENT AND TRADEMARK OFFICE
CERTIFICATE OF CORRECTION

PATENT NO.    : 6,577,553 B2
DATED         : June 10, 2003
INVENTOR(S)   : Ryu Makabe et al.

It is certified that error appears in the above-identified patent and that said Letters Patent is hereby corrected as shown below:

<u>Column 22,</u>
Line 51, change "either" to -- any --;
Lines 61 and 65, change "7" to -- 8 --.

Signed and Sealed this

Fourth Day of November, 2003

JAMES E. ROGAN
*Director of the United States Patent and Trademark Office*